(12) United States Patent
Shilimkar et al.

(10) Patent No.: US 11,476,209 B2
(45) Date of Patent: Oct. 18, 2022

(54) RF AMPLIFIERS WITH SERIES-COUPLED OUTPUT BONDWIRE ARRAYS AND SHUNT CAPACITOR BONDWIRE ARRAY

(71) Applicant: NXP B.V., Eindhoven (NL)

(72) Inventors: Vikas Shilimkar, Chandler, AZ (US); Kevin Kim, Gilbert, AZ (US); Richard Emil Sweeney, Chandler, AZ (US); Eric Matthew Johnson, Tempe, AZ (US)

(73) Assignee: NXP B.V., Eindhoven (NL)

( * ) Notice: Subject to any disclaimer, the term of this patent is extended or adjusted under 35 U.S.C. 154(b) by 427 days.

(21) Appl. No.: 16/746,371

(22) Filed: Jan. 17, 2020

(65) Prior Publication Data

US 2021/0225784 A1 Jul. 22, 2021

(51) Int. Cl.
*H01L 23/66* (2006.01)
*H01L 23/13* (2006.01)
(Continued)

(52) U.S. Cl.
CPC .............. *H01L 23/66* (2013.01); *H01L 23/13* (2013.01); *H01L 23/49517* (2013.01); *H01L 23/552* (2013.01); *H01L 24/32* (2013.01); *H01L 24/48* (2013.01); *H01L 24/49* (2013.01); *H01L 24/73* (2013.01); *H01L 24/83* (2013.01);
(Continued)

(58) Field of Classification Search
CPC ... H01L 23/66; H01L 23/13; H01L 23/49517; H01L 23/552; H01L 24/32; H01L 24/48; H01L 24/49; H01L 24/73; H01L 24/83; H01L 24/85; H01L 24/92; H01L 24/06; H01L 24/05; H01L 25/16; H01L 2223/6611; H01L 2223/6655; H01L 2223/6672; H01L 2224/32245; H01L 2224/48091; H01L 2224/48137; H01L 2224/48175; H01L 2224/49176; H01L 2224/73265; H01L 2224/0557; H01L 2224/0603; H01L 2224/05553; H01L 2224/48195; H01L 2224/49109; H01L 2224/49111; H01L 2224/49175; H01L 2924/13091; H01L 2924/19011; H01L 2924/19041; H01L 2924/30111; H01L 2924/00014; H01L 2924/1304; H03F 1/565; H03F 1/0288; H03F 3/193; H03F 3/211; H03F 2200/222; H03F 2200/387; H03F 2200/451

See application file for complete search history.

(56) References Cited

U.S. PATENT DOCUMENTS 6,181,200 B1 * 1/2001 Titizian ................. H01L 23/642
330/307
8,030,763 B2 10/2011 Romero et al.
(Continued)

FOREIGN PATENT DOCUMENTS

EP 3160044 A1 * 4/2017 ............. H01L 23/66

*Primary Examiner* — Sitaramarao S Yechuri

(57) ABSTRACT

Various embodiments relate to a packaged radio frequency (RF) amplifier device implementing a split bondwire where the direct ground connection of an output capacitor is replaced with a set of bondwires connecting to ground in a direction opposite to the wires connecting to the output of a transistor to an output pad. This is done in order to reduce the effects of mutual inductance between the various bondwires associated with the output of the RF amplifier device.

17 Claims, 9 Drawing Sheets

(51) Int. Cl.
*H01L 23/495* (2006.01)
*H01L 23/552* (2006.01)
*H01L 23/00* (2006.01)
*H01L 25/16* (2006.01)
*H03F 1/56* (2006.01)
*H03F 3/193* (2006.01)

(52) U.S. Cl.
CPC .............. *H01L 24/85* (2013.01); *H01L 24/92* (2013.01); *H01L 25/16* (2013.01); *H03F 1/565* (2013.01); *H03F 3/193* (2013.01); *H01L 2223/6611* (2013.01); *H01L 2223/6655* (2013.01); *H01L 2223/6672* (2013.01); *H01L 2224/32245* (2013.01); *H01L 2224/48091* (2013.01); *H01L 2224/48137* (2013.01); *H01L 2224/48175* (2013.01); *H01L 2224/49176* (2013.01); *H01L 2224/73265* (2013.01); *H01L 2924/13091* (2013.01); *H01L 2924/19011* (2013.01); *H01L 2924/19041* (2013.01); *H01L 2924/30111* (2013.01); *H03F 2200/222* (2013.01); *H03F 2200/387* (2013.01); *H03F 2200/451* (2013.01)

(56) References Cited

U.S. PATENT DOCUMENTS

| | | | |
|---|---|---|---|
| 8,076,761 B1 | 12/2011 | Long | |
| 9,589,927 B2 | 3/2017 | Szymanowski et al. | |
| 9,628,027 B2 | 4/2017 | Embar et al. | |
| 9,941,227 B2 | 4/2018 | Zhu et al. | |
| 2004/0012457 A9* | 1/2004 | Soltan | H01L 24/49 333/33 |
| 2012/0075023 A1* | 3/2012 | Guo | H03F 1/0277 330/296 |
| 2012/0146723 A1* | 6/2012 | Blednov | H01L 23/66 330/192 |
| 2013/0265107 A1* | 10/2013 | Holmes | H01L 23/64 330/124 R |
| 2014/0312976 A1* | 10/2014 | Noori | H03F 3/68 330/295 |
| 2015/0115893 A1* | 4/2015 | Lee | H05K 1/181 320/135 |
| 2016/0142015 A1 | 5/2016 | Volokhine et al. | |
| 2016/0142025 A1 | 5/2016 | Volokhine | |
| 2016/0173039 A1* | 6/2016 | Frei | H03F 1/0288 29/831 |
| 2017/0117239 A1* | 4/2017 | Lembeye | H03F 1/565 |
| 2019/0229077 A1 | 7/2019 | De Boet et al. | |

* cited by examiner

RF AMPLIFIERS WITH SERIES-COUPLED OUTPUT BONDWIRE ARRAYS AND SHUNT CAPACITOR BONDWIRE ARRAY

Various embodiments disclosed herein relate generally amplifier circuits that include bondwires as inductive elements.

BACKGROUND

Packaged radio frequency (RF) transistors may be coupled to other passive elements using bondwire arrays. These bondwire arrays act as inductors and some are designed to be part of the input and output passive circuits associated with for example a packaged RF transistor. These bondwire arrays interact with one another due to mutual inductance which affects the characteristics of the circuits using the bondwire arrays.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Mutual inductance, when present in power amplifier circuits using packaged RF transistors, affects the overall performance and operating characteristics of the power amplifier circuit. Embodiments of a power amplifier circuit architecture using a "split" bondwire array are disclosed herein that reduce potentially negative effects of mutual inductance of bondwires at the output of the power amplifier circuit.

Figure 1:
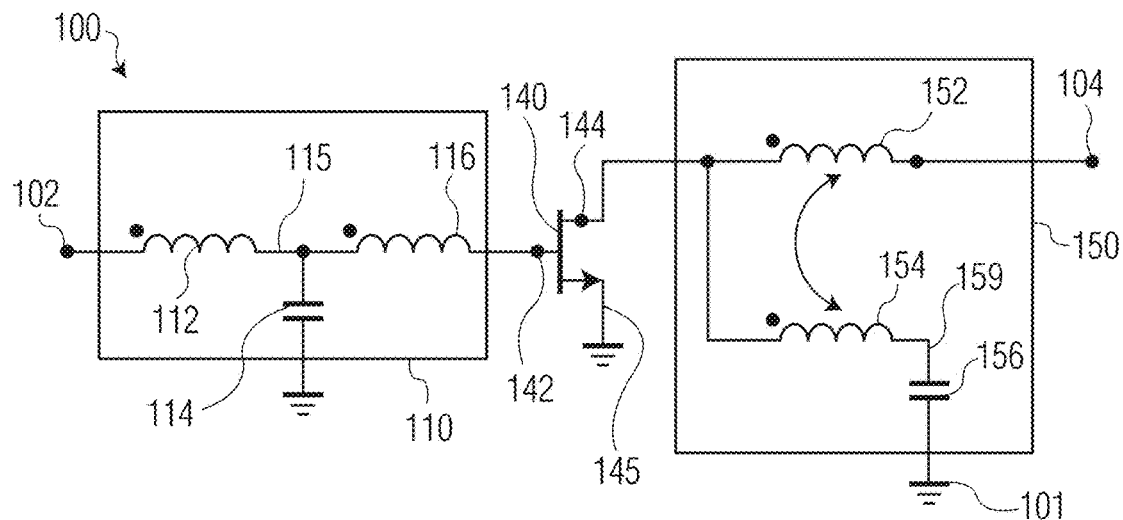
FIG. 1 is a schematic diagram of an RF power amplifier circuit.

FIG. 1 is a schematic diagram of an RF power amplifier circuit 100. Circuit 100 includes an input 102 (e.g., a first conductive package lead), an input impedance matching circuit 110, a transistor 140, an output impedance matching circuit 150, and an output lead 104 (e.g., a second conductive package lead). Each of the input and output 102, 104 may be more generally referred to as an "RF input/output (I/O)."

Input 102 and output 104 each may include a conductor, which is configured to enable the circuit 100 to be electrically coupled with external circuitry (not shown). More specifically, the input and output 102, 104 are physically positioned to span between the exterior and the interior of a device package. Input impedance matching circuit 110 is electrically coupled between the input 102 and a first terminal 142 of transistor 140 (e.g., the gate terminal). Similarly, output impedance matching circuit 150 is electrically coupled between a second terminal 144 of transistor 140 (e.g., the drain terminal) and the output 104. A third terminal 145 of transistor 140 (e.g., the source terminal) is coupled to a ground reference node.

Transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate terminal (control terminal 142), a drain terminal (a first current conducting terminal 144), and a source terminal (a second current conducting terminal 145). Using nomenclature typically applied to FETs, the gate terminal 142 of transistor 140 is coupled to the input impedance matching circuit 110, the drain terminal 144 of transistor 140 is coupled to the output impedance matching circuit 150, and the source terminal 145 of transistor 140 is coupled to ground (or another voltage reference). Through the variation of control signals provided to the gate terminal of transistor 140, the current between the current conducting terminals 144, 145 of transistor 140 may be modulated.

As mentioned above, the input impedance matching circuit 110 is electrically coupled between the input 102 and a first terminal 142 of transistor 140 (e.g., the gate terminal). Input impedance matching circuit 110 is configured to transform (e.g., raise) the gate impedance of transistor 140 to a higher (e.g., intermediate or higher) impedance level (e.g., in a range from about 2 to about 10 ohms or higher) at node 102.

The input impedance matching circuit 110 includes a first series inductive element 112 (e.g., a first set of bondwires) coupled between input 102 and a first node 115 (also referred to as a "connection node"). Besides functioning to make the electrical connection between the input 102 and node 115, the first inductive element 112 also may add reactance to a final transformed impedance provided by the input impedance matching circuit 110.

Series inductive element 116 (e.g., a second set of bondwires) is coupled between input 102 (or more specifically inductance 112 or connection node 115) and the control terminal 142 of transistor 140. Accordingly, inductive elements 112, 116 are connected in series with each other between input 102 and the control terminal 142 of transistor 140. A first terminal of shunt capacitance 114 is coupled to the connection node 115, and a second terminal of shunt capacitance 114 is coupled to ground (or another voltage reference).

On the output side of the circuit 100, output impedance matching circuit 150 is coupled between the first current conducting terminal 144 (e.g., drain terminal) of transistor 140 and the output 104. Output impedance matching circuit 150 is configured to match the output impedance of circuit 100 with the input impedance of an external circuit or component (not shown) that may be coupled to output 104. Output impedance matching circuit 150 may have any of a number of different circuit configurations, and just one example is shown in FIG. 1. More specifically, in the non-limiting example shown in FIG. 1, output impedance matching circuit 150 includes two inductive elements 152, 154 and shunt capacitance 156. A first inductive element 152 (e.g., a third set of bondwires) is coupled between the first current conducting terminal 144 (e.g., drain terminal) of transistor 140 and the output 104. A second inductive element 154 (e.g., a fourth set of bondwires) is coupled between the first current conducting terminal 144 of transistor 140 and a node 159, which corresponds to another RF low-impedance point. A second terminal of the shunt capacitance 156 is coupled to ground (or to another voltage reference).

Figure 2:
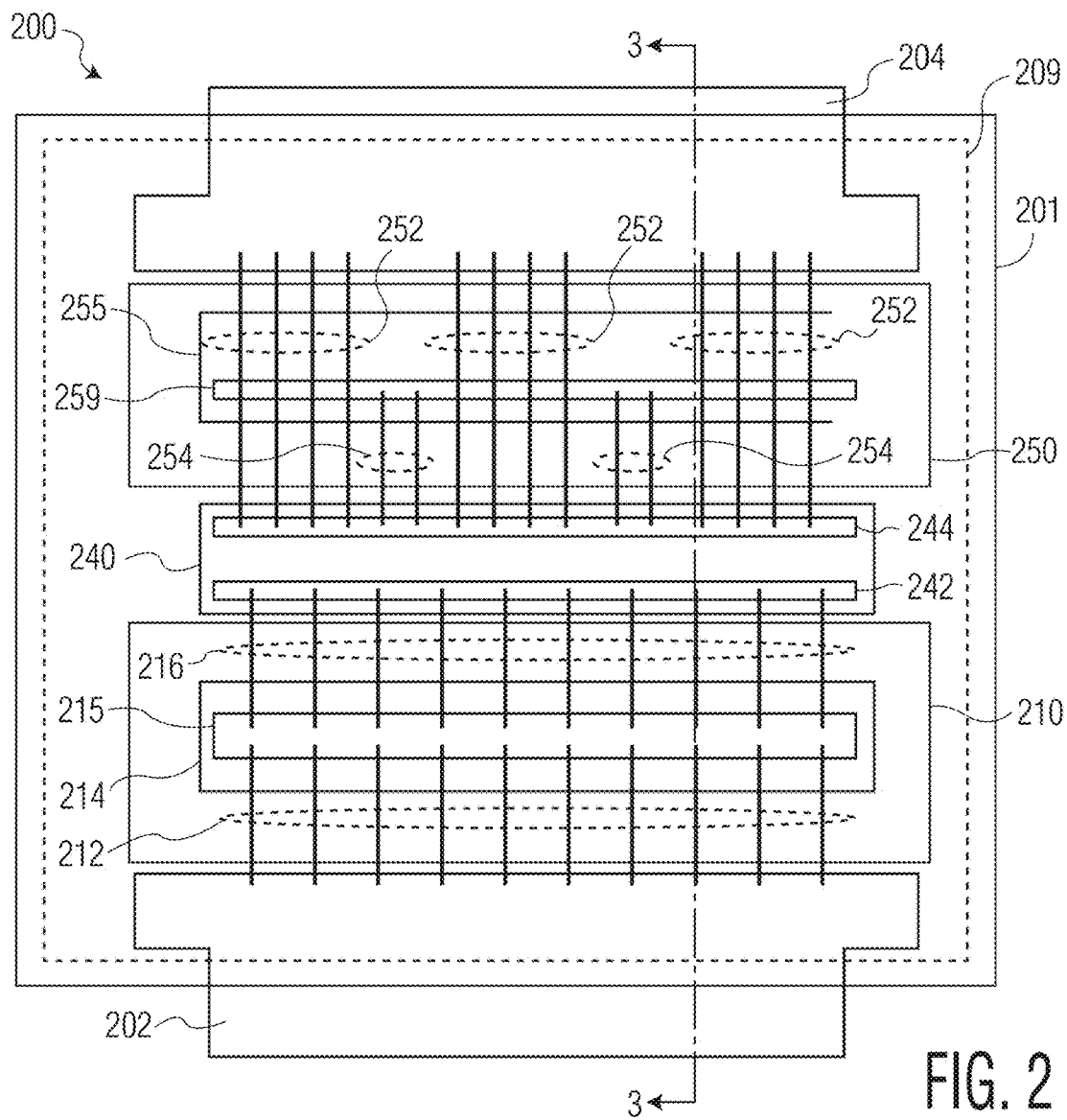
FIG. 2 is a top view of a layout of an RF amplifier device that embodies an instance of the circuit of FIG. 1.
Figure 3:
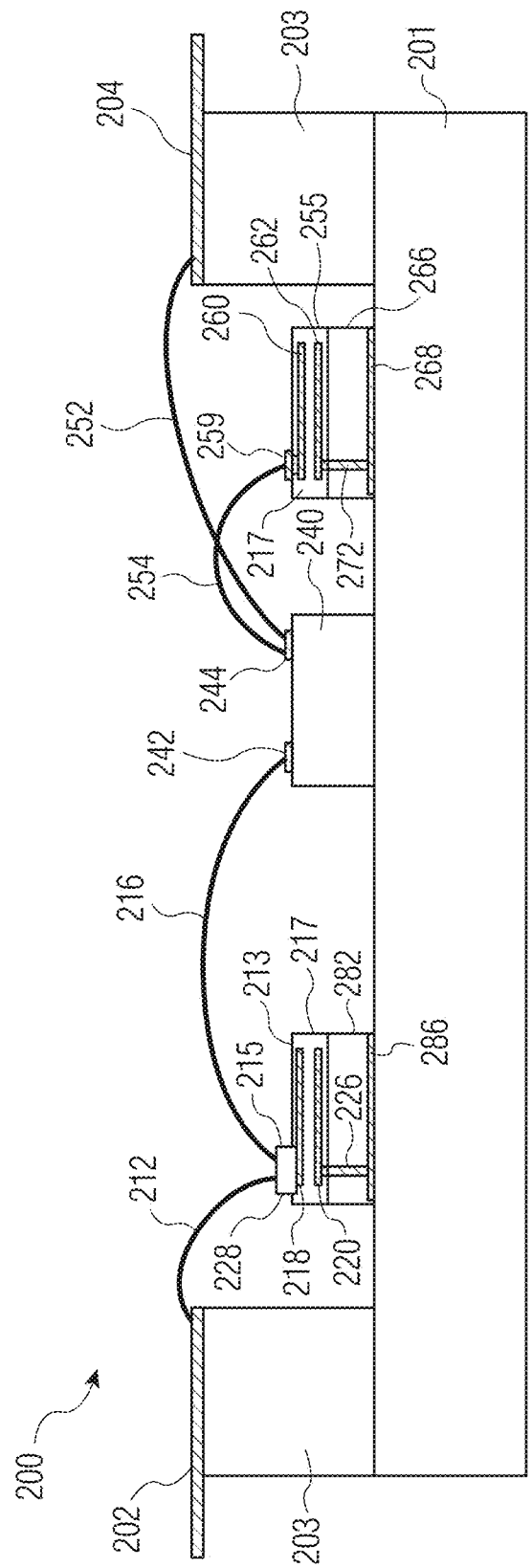
FIG. 3 includes a cross-sectional, side view of FIG. 2 along line 3-3.

For example, FIG. 2 is a top view of a layout of RF amplifier device 200 that embodies an instance of the circuit 100 of FIG. 1, and which may be utilized to provide amplifiers, and portions of matching networks in a Doherty amplifier. In addition, two instances of the RF amplifier device 200 may be incorporated into on package to provide the two amplifiers used in the Doherty amplifier. FIG. 3 includes a cross-sectional, side view of FIG. 2 along line 3-3.

Device 200 includes a flange 201 (or "device substrate"), which includes a rigid electrically-conductive substrate with a thickness that is sufficient to provide structural support for various electrical components and elements of device 200. In addition, flange 201 may function as a heat sink for transistor die 240 and other devices mounted on flange 201. Flange 201 has top and bottom surfaces (only a central portion of the top surface is visible in FIG. 2), and a substantially-rectangular perimeter that corresponds to the perimeter of the device 200.

Flange 201 is formed from an electrically conductive material, and may be used to provide a ground reference node for the device 200. For example, various components and elements may have terminals that are electrically coupled to flange 201, and flange 201 may be electrically coupled to a system ground when the device 200 is incorporated into a larger electrical system. At least the top surface of flange 201 is formed from a layer of conductive material, and possibly all of flange 201 is formed from bulk conductive material.

An isolation structure (203, FIG. 3) is attached to the top surface of flange 201. The isolation structure 203, which is formed from a rigid, electrically insulating material, provides electrical isolation between conductive features of the device (e.g., between leads 202, 204 and flange 201). The isolation structure 203 has a frame shape, which includes a substantially enclosed, four-sided structure with a central opening. The isolation structure 203 may have a substantially rectangular shape or isolation may have another shape (e.g., annular ring, oval, and so on).

A portion of the top surface of flange 201 that is exposed through the opening in the isolation structure 203 is referred to herein as the "active area" of device 200. Transistor die 240 is positioned within the active device area of device 200, along with integrated passive device (IPD) assemblies 213 and 255, which will be described in more detail later. For example, the transistor die 240 and IPD assemblies 213 and 255 may be coupled to the top surface of flange 201 using conductive epoxy, solder, solder bumps, sintering, and/or eutectic bonds.

Device 200 houses an amplification path that represents a physical implementation of circuit 100 (FIG. 1). When incorporated into a Doherty amplifier, the amplification path may correspond to a main amplifier path or a peaking amplifier path.

Device 200 includes an input lead 202 (e.g., input 102, FIG. 1), an output lead 204 (e.g., output 204, FIG. 1), transistor die 240 (e.g., transistor 140, FIG. 1), an input impedance matching circuit 210 (e.g., input impedance matching circuit 110, FIG. 1), and an output impedance matching circuit 250 (e.g., output impedance matching circuit 150, FIG. 1). Some components of the input impedance matching circuit 210 may be implemented within IPD assembly 213, and some of the components of the output impedance matching circuit 250 may be implemented within IPD assembly 255.

The input and output leads 202 and 204 are mounted on a top surface of the isolation structure 203 on opposed sides of the central opening, and thus the input and output leads 202 and 204 are elevated above the top surface of the flange 201, and are electrically isolated from the flange 201. Generally, the input and output leads 202 and 204 are oriented to allow for attachment of bondwires between the input and output leads 202 and 204 and components and elements within the central opening of isolation structure 203.

Transistor die 240 includes an integrated power FET, where the FET has a control terminal (e.g., a gate terminal) and two current conducting terminals (e.g., a drain terminal and a source terminal). The control terminal of the FET within transistor die 240 is coupled through the input impedance matching circuit 210 to the input lead 202. More specifically, the power transistor die 240 includes a transistor input terminal 242 (e.g., a conductive bond pad), which is electrically connected within the power transistor die 240 to a control terminal (e.g., a gate terminal) of a single-stage or final-stage FET integrated within the die 240. In addition, one current conducting terminal (e.g., the drain terminal) of the FET within transistor die 240 is coupled through the output impedance matching circuit 250 to the output lead 204. The other current conducting terminal (e.g., the source terminal) of a FET within transistor die 240 is electrically coupled through the die 240 to the flange 201 (e.g., to ground).

The IPD assembly 213 also may include a base semiconductor substrate 282 (e.g., a silicon substrate, a silicon carbide substrate, a GaN substrate, or another type of semiconductor substrate, which may be referred to as an "IPD substrate" herein) and a build-up structure of alternating dielectric 217 and patterned conductive layers. As will be discussed in more detail below, a shunt capacitor 214 (e.g., capacitor 114, FIG. 1) of the input impedance matching circuit 210 is integrally formed within the IPD assembly 213, with a first terminal that is electrically connected to conductive bond pad 215 at the top surface of the IPD assembly 213, and with a second terminal that is electrically connected to the conductive flange 201 (e.g., to ground) using through substrate vias 226 to a conductive layer 286 on a bottom surface of the IPD assembly 213.

For example, the input impedance matching circuit 210 may include two inductive elements 212, 216 (e.g., inductive elements 112, 116, FIG. 1) and a shunt capacitor 213 (e.g., shunt capacitance 114, FIG. 1). The first inductive element 212 (e.g., inductive element 112, FIG. 1) may be implemented as a first set of bondwires that are coupled between the input lead 202 and a conductive bond pad 215 (e.g., corresponding to connection node 115, FIG. 1) on a top surface of the IPD assembly 213 The second inductive element 216 (e.g., inductive element 116, FIG. 1) may be implemented as a second set of bondwires that are coupled between bond pad 215 (corresponding to connection node 115, FIG. 1) and the input terminal 242 of the transistor die 240.

A first electrode (or terminal) of the shunt capacitor 213 (e.g., shunt capacitor 114, FIG. 1) is electrically coupled to the conductive bond pad 215 (and thus to bondwires 216), and a second electrode (or terminal) of the shunt capacitor 214 is electrically coupled to the conductive flange (e.g., using conductive through substrate vias 226 that extend through the semiconductor substrate).

The IPD assembly 255 also may include a base semiconductor substrate 266 (e.g., which may be referred to as an "IPD substrate" herein) and a build-up structure of alternating dielectric 257 and patterned conductive layers. As will be discussed in more detail below, a shunt capacitor 256 (e.g., capacitor 156, FIG. 1) of the output impedance matching circuit 250 is integrally formed within the IPD assembly 255, with a first terminal that is electrically connected to conductive bond pad 259 at the top surface of the IPD assembly 255, and with a second terminal that is electrically connected to the conductive flange 201 (e.g., to ground) using through substrate vias 272 to a conductive layer 268 on a bottom surface of the IPD assembly 255.

First, connections between the transistor die 240 and the output lead 204 through the output impedance matching circuit 250 will be described in more detail. More specifically, an output lead 204 is electrically coupled, through an instance of an output impedance matching circuit 250, to the second terminal 244 of the transistor die 240. The second terminal 244, in turn, is electrically coupled to the drain terminal of a FET within the transistor die 240.

For example, the output impedance matching circuit 240 may include two inductive elements 252, 254 (e.g., inductive elements 152, 154, FIG. 1) and a shunt capacitor 256 (e.g., shunt capacitance 156, FIG. 1). The first inductive element 252 (e.g., inductive element 152, FIG. 1) may be implemented as a third set of bondwires that are coupled between the output lead 204 and a conductive bond pad 244 (e.g., corresponding to terminal 144, FIG. 1) on a top surface of the transistor die 240. The second inductive element 254 (e.g., inductive element 154, FIG. 1) may be implemented as a fourth set of bondwires that are coupled between bond pad 259 (corresponding to connection node 159, FIG. 1) and the bond pad 244 of the transistor die 240.

A first electrode (or terminal) of the shunt capacitor 256 (e.g., shunt capacitor 156, FIG. 1) is electrically coupled to the conductive bond pad 259 (and thus to bondwires 254), and a second electrode 262 (or terminal) of the shunt capacitor 256 is electrically coupled to the conductive flange (e.g., using conductive through substrate vias 272 that extend through the semiconductor substrate 266).

Device 200 is incorporated in an air cavity package, in which transistor die 240, the IPD assemblies 213 and 255, and various other components are located within an enclosed air cavity. Basically, the air cavity is bounded by flange 201, the isolation structure 203, and a cap (not shown) overlying and in contact with the isolation structure 203 and leads 202 and 204. In FIG. 2, an example interior perimeter of the cap is indicated by dashed box 209, while an exterior perimeter would approximately align with the outer perimeter of flange 201. Alternatively, the components of device 200 may be incorporated into an overmolded package (i.e., a package in which the electrical components within the active device area are encapsulated with a non-conductive molding compound, and in which portions of the leads 202 and 240 also may be encompassed by the molding compound). In an overmolded package, the isolation structure may be excluded.

A positive magnetic coupling exists between bondwire array 254 (which acts as a shunt inductor 154) and bondwire array 252 (which acts as output feed inductor 142) due to a parallel arrangement of the two bondwire arrays because the bondwire arrays are in close proximity. This positive magnetic coupling results in positive mutual inductance. However, this positive mutual inductance causes significant challenges in the output matching network 150 design.

Embodiments will now be described that reduce the mutual coupling between output matching network bondwire arrays 252, 254. These embodiments may reduce or eliminate the positive mutual inductance between bondwire arrays 252 and 254 and significantly improve the matching network transformation.

These embodiments "split" the bondwire array 252 into forward and reverse bondwire arrays. As used herein, the term "split," as used to describe a bondwire array, means adding an additional set of bondwires to connect a terminal of the shunt capacitor to ground. The forward bondwire array connects the second terminal of the transistor die to a top plate of the output shunt capacitor. The reverse bondwire array connects bottom plate of the output shunt capacitor to the package flange or to a ground node of the transistor die.

The proposed arrangement of the split bondwire array electromagnetically couples to the output bondwire array in a way that creates an effective negative mutual inductance between them. Further, this arrangement shields the output bondwire array from coupling (electric and magnetic) to the shunt inductor bondwire array and also shields RF signal path coupling to adjacent paths when multi-up RF transistors are used. The split bondwire arrangement also improves the impedance transformation thereby potentially eliminating the need for a bondback matching network. The split bondwire arrangement also improves isolation between the bondwire arrays 216 and 254. Finally, the split bondwire arrangement eliminates the need for through substrate vias (TSVs)

in the output IPD assembly, which helps to increase reliability of the device and reduce the complexity associated with forming the TSVs.

Figure 4:
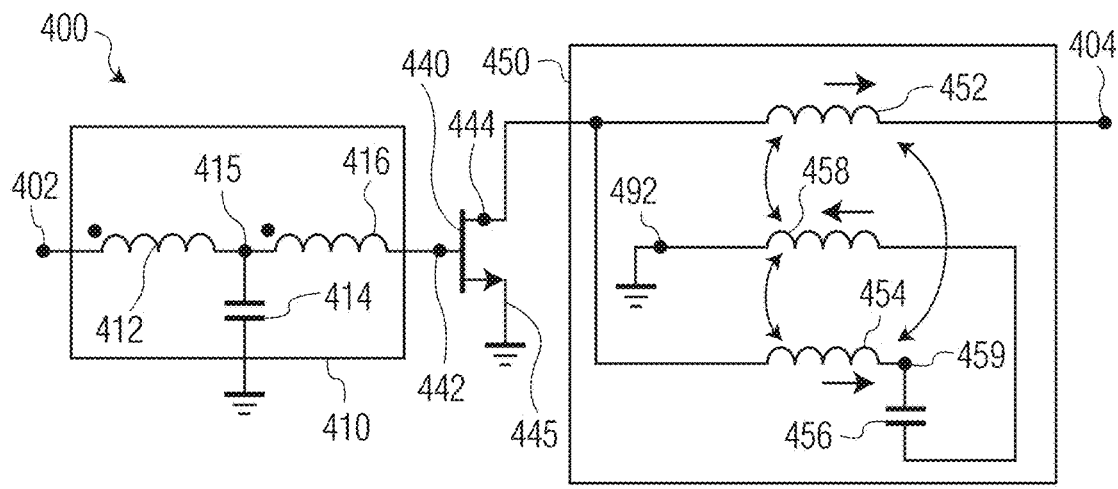
FIG. 4 is a schematic diagram of an embodiment of an RF power amplifier circuit using split bondwires.

FIG. 4 is a schematic diagram of an embodiment of an RF power amplifier circuit 400 using split bondwires. Circuit 400 includes an input 402 (e.g., a first conductive package lead), an input impedance matching circuit 410, a transistor 440, an output impedance matching circuit 450, and an output lead 404 (e.g., a second conductive package lead), in an embodiment. Each of the input and output 402, 404 may be more generally referred to as an "RF input/output (I/O)."

The input impedance matching circuit 410 may be referred to as an "input circuit." Similarly, the output impedance matching circuit 450 may be referred to as an "output circuit." Although transistor 440 and various elements of the input and output impedance matching circuits 410, 450 are shown as singular components, the depiction is for the purpose of ease of explanation only. Those of skill in the art would understand, based on the description herein, that transistor 440 and/or certain elements of the input impedance matching circuit 410, and the output impedance matching circuit 450 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 440 and various elements of the input impedance matching circuit 410, and the output impedance matching circuit 450, below, thus are not intended to limit the scope of the inventive subject matter only to the illustrated embodiments.

Input 402 and output 404 each may include a conductor, which is configured to enable the circuit 400 to be electrically coupled with external circuitry (not shown). More specifically, the input and output 402, 404 are physically positioned to span between the exterior and the interior of a device package, in an embodiment. Input impedance matching circuit 410 is electrically coupled between the input 402 and a first terminal 442 of transistor 440 (e.g., the gate terminal). Similarly, output impedance matching circuit 450 is electrically coupled between a second terminal 444 of transistor 440 (e.g., the drain terminal) and the output 404. A third terminal 445 of transistor 440 (e.g., the source terminal) is coupled to a ground reference node.

According to an embodiment, transistor 440 is the primary active component of circuit 400. Transistor 440 includes a control terminal 442 and two current conducting terminals 444, 445, where the current conducting terminals 444, 445 are spatially and electrically separated by a variable-conductivity channel. For example, transistor 440 may be a field effect transistor (FET), which includes a gate terminal (control terminal 442), a drain terminal (a first current conducting terminal 444), and a source terminal (a second current conducting terminal 445). According to an embodiment, and using nomenclature typically applied to FETs in a non-limiting manner, the gate terminal 442 of transistor 440 is coupled to the input impedance matching circuit 410, the drain terminal 444 of transistor 440 is coupled to the output impedance matching circuit 450, and the source terminal 445 of transistor 440 is coupled to ground (or another voltage reference). Through the variation of control signals provided to the gate terminal of transistor 440, the current between the current conducting terminals of transistor 440 may be modulated.

According to various embodiments, transistor 440 may be silicon-based FET (e.g., a laterally-diffused metal-oxide semiconductor (LDMOS) FET). In other embodiments, the transistor 440 may be a gallium-based FET (e.g., gallium arsenide, gallium phosphide, or gallium nitride) (e.g., a high electron mobility transistor (HEMT)). The transistor 440 may use other III-V materials (e.g., indium phosphide or indium antimonide) using other architectures as well.

As mentioned above, the input impedance matching circuit 410 is electrically coupled between the input 402 and a first terminal 442 of transistor 440 (e.g., the gate terminal).

The input impedance matching circuit 410 is coupled between connection node 415 and the control terminal 442 (e.g., gate terminal) of the transistor 440. Input impedance matching circuit 410 is configured to transform (e.g., raise) the gate impedance of transistor 440 to a higher (e.g., intermediate or higher) impedance level (e.g., in a range from about 2 to about 10 ohms or higher) at node 402. This is advantageous in that it allows the printed circuit board level (PCB-level) matching interface from a driver stage to have an impedance that can be achieved in high-volume manufacturing with minimal loss and variation (e.g., a "user friendly" matching interface). The input impedance matching circuit 410 includes a first series inductive element 412 (e.g., a first set of bondwires) coupled between input 402 and a first node 415 (also referred to as a "connection node"). Besides functioning to make the electrical connection between the input 402 and node 415, the first inductive element 412 also may add reactance to a final transformed impedance provided by the input impedance matching circuit 410. Series inductive element 416 (e.g., a second set of bondwires) is coupled in series between input 402 (or more specifically inductance 412 or connection node 415) and the control terminal 442 of transistor 440. Accordingly, inductive elements 412, 416 are connected in series with each other between input 402 and the control terminal 442 of transistor 440. A first terminal of shunt capacitance 414 is coupled to the connection node 415, and a second terminal of shunt capacitance 414 is coupled to ground (or another voltage reference).

According to an embodiment, series inductive elements 412, 416 and shunt capacitance 414 form a low-pass filter of the input matching circuit 410. The low-pass configuration allows for wideband operation at RF frequencies below the cut-off frequency of the low-pass filter.

According to an embodiment, inductive element 412 may have an inductance value in a range between about 150 picohenries (pH) to about 450 pH, inductive element 416 may have an inductance value in a range between about 150 pH to about 450 pH, and shunt capacitance 414 may have a capacitance value in a range between about 10 pF to about 100 pF. Desirably, shunt capacitance 414 has a relatively-large capacitance (e.g., greater than about 10 pF) to provide an acceptable RF low-impedance point at connection node 415. In other embodiments, some or all of the above-listed components may have smaller or larger component values than the above-given ranges.

On the output side of the circuit 400, output impedance matching circuit 450 is coupled between the first current conducting terminal 444 (e.g., drain terminal) of transistor 440 and the output 404. Output impedance matching circuit 450 is configured to match the output impedance of circuit 400 with the input impedance of an external circuit or component (not shown) that may be coupled to output 404. Output impedance matching circuit 450 may have any of a number of different circuit configurations, and just one example is shown in FIG. 4. More specifically, in the non-limiting example shown in FIG. 4, output impedance matching circuit 450 includes three inductive elements 452, 454, 458 and shunt capacitance 456. A first inductive element 452 (e.g., a third set of bondwires) is coupled between the first current conducting terminal 444 (e.g., drain terminal) of transistor 440 and the output 404. A second inductive element 454 (e.g., a fourth set of bondwires) is coupled between the first current conducting terminal 444 of transistor 440 and a node 459, which in turn is coupled to a first terminal of the shunt capacitance 456 and may correspond to another RF low-impedance point, in an embodiment. A third inductive element 458 (e.g., a fifth set of bondwires) is coupled between a second terminal of the shunt capacitance 456 and ground (or to another voltage reference), in an embodiment.

Figure 5:
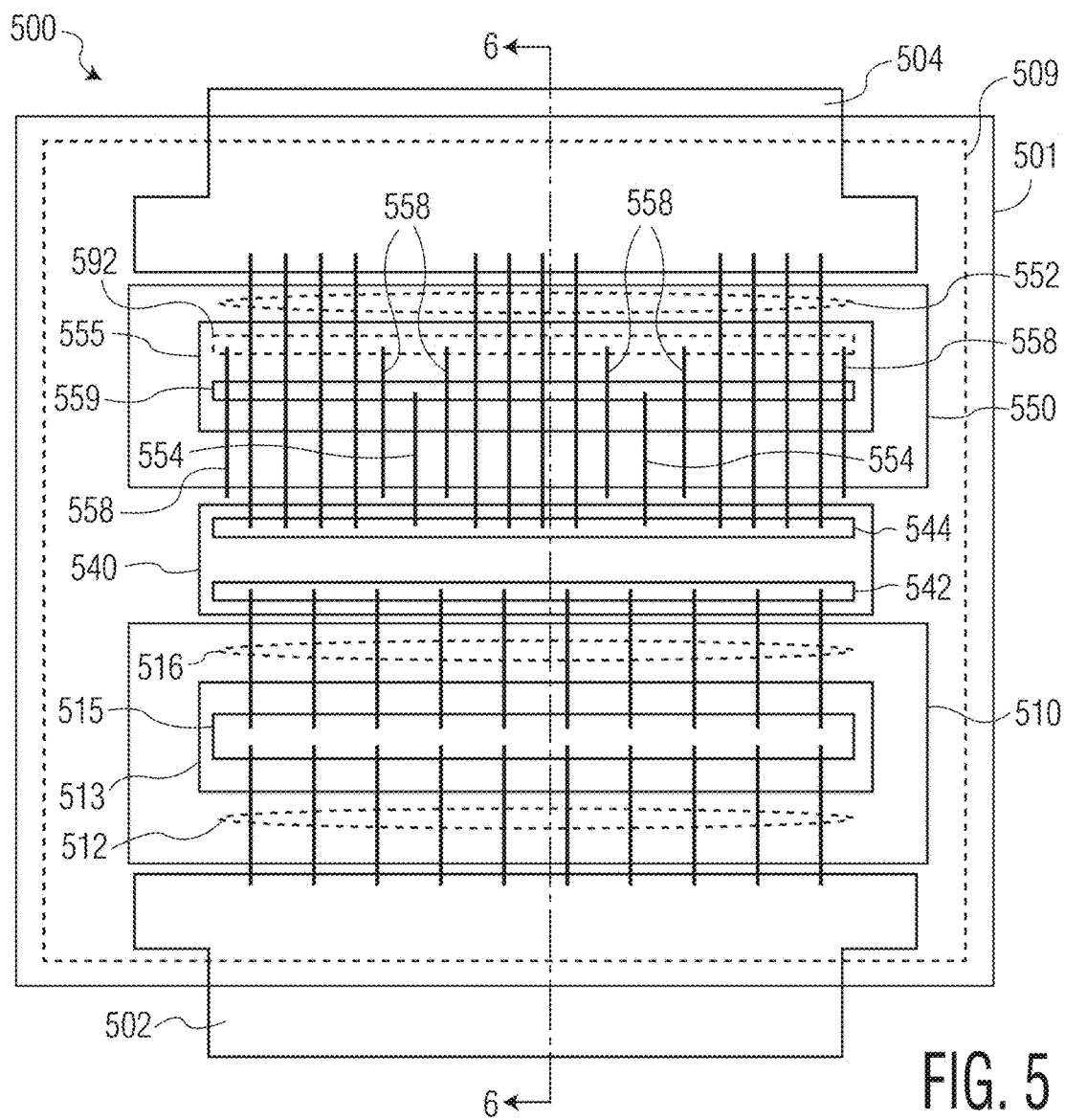
FIG. 5 is a top view of an embodiment of a layout of an RF amplifier device that embodies an instance of the circuit of FIG. 4.
Figure 6:
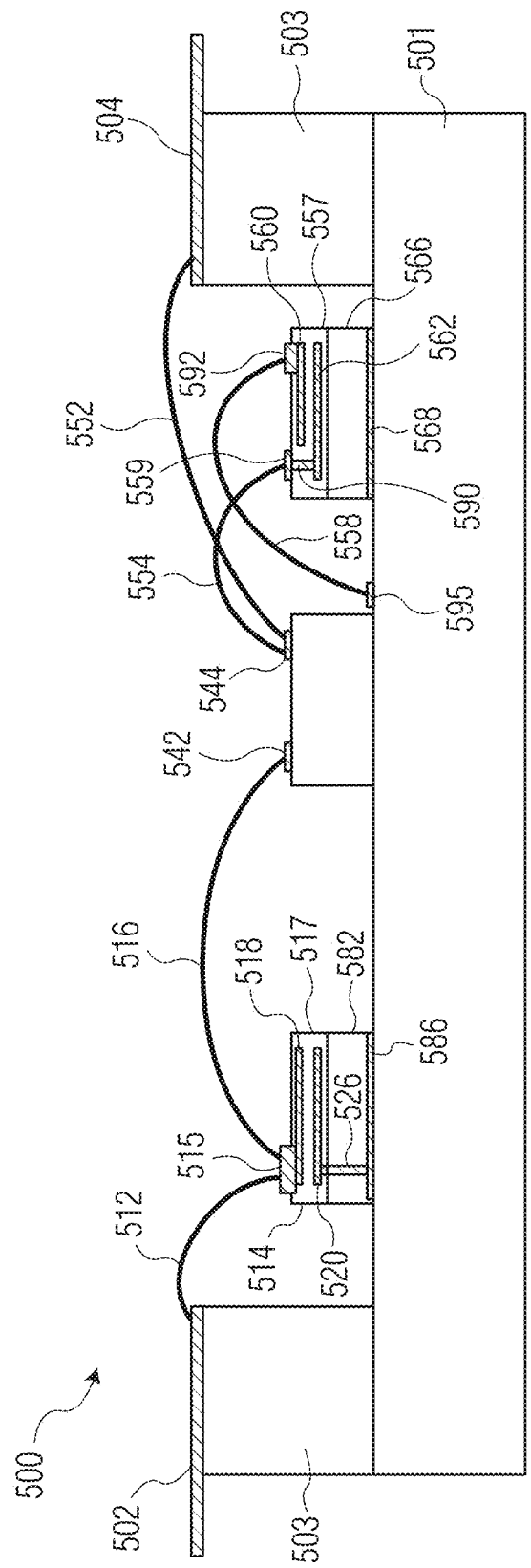
FIG. 6 includes a cross-sectional, side view of FIG. 5 along line 6-6, in accordance with an example embodiment.

For example, FIG. 5 is a top view of an embodiment of a layout of an RF amplifier device 500 that embodies an instance of the circuit 400 of FIG. 4, and which may be utilized to provide amplifiers, and portions of matching networks in a Doherty amplifier. In addition, two instances of the RF amplifier device 500 may be incorporated into a package to provide the two amplifiers (e.g., a main (or carrier) and a peaking amplifier) used in the Doherty amplifier. FIG. 6 includes a cross-sectional, side view of FIG. 5 along line 6-6, in accordance with an example embodiment.

Device 500 includes a flange 501 (or "device substrate"), in an embodiment, which includes a rigid electrically-conductive substrate with a thickness that is sufficient to provide structural support for various electrical components and elements of device 500. In addition, flange 501 may function as a heat sink for transistor die 540 and other devices mounted on flange 501. Flange 501 has top and bottom surfaces (only a central portion of the top surface is visible in FIG. 5), and a substantially-rectangular perimeter that corresponds to the perimeter of the device 500.

Flange 501 is formed from an electrically conductive material, and may be used to provide a ground reference node for the device 500. For example, various components and elements may have terminals that are electrically coupled to flange 501, and flange 501 may be electrically coupled to a system ground when the device 500 is incorporated into a larger electrical system. At least the top surface of flange 501 is formed from a layer of conductive material, and possibly all of flange 501 is formed from bulk conductive material.

An isolation structure (503 of FIG. 6) is attached to the top surface of flange 501, in an embodiment. The isolation structure 503, which is formed from a rigid, electrically insulating material, provides electrical isolation between conductive features of the device (e.g., between leads 502, 504 and flange 501). The isolation structure 503 has a frame shape, in an embodiment, which includes a substantially enclosed, four-sided structure with a central opening. The isolation structure 503 may have a substantially rectangular shape or isolation may have another shape (e.g., annular ring, oval, and so on).

A portion of the top surface of flange 501 that is exposed through the opening in the isolation structure 503 is referred to herein as the "active area" of device 500. Transistor die 540 is positioned within the active device area of device 500, along with IPD assemblies 513 and 555, which will be described in more detail later. For example, the transistor die 540 and IPD assemblies 513 and 555 may be coupled to the top surface of flange 501 using conductive epoxy, solder, solder bumps, sintering, and/or eutectic bonds.

Device 500 houses an amplification path that represents a physical implementation of circuit 400 (FIG. 4). When incorporated into a Doherty amplifier, the amplification path may correspond to a main amplifier path or a peaking amplifier path.

Device 500 includes an input lead 502, an output lead 504, transistor die 540 (e.g., transistor 440, FIG. 4), an input impedance matching circuit 510 (e.g., input impedance matching circuit 410, FIG. 4), and an output impedance matching circuit 550 (e.g., output impedance matching circuit 450, FIG. 4).

The input and output leads 502 and 504 are mounted on a top surface of the isolation structure 503 on opposed sides of the central opening, and thus the input and output leads 502 and 504 are elevated above the top surface of the flange 501, and are electrically isolated from the flange 501. Generally, the input and output leads 502 and 504 are oriented to allow for attachment of bondwires between the input and output leads 502 and 504 and components and elements within the central opening of isolation structure 503.

Transistor die 540 includes an integrated power FET (e.g., a single-stage or final-stage FET), where the FET has a control terminal (e.g., a gate terminal) and two current conducting terminals (e.g., a drain terminal and a source terminal). A control terminal of a FET within transistor die 540 is coupled through a transistor input terminal 542 to the input impedance matching circuit 510, and thus to the input lead 502. In addition, one current conducting terminal (e.g., the drain terminal) of the FET within transistor die 540 is coupled through the output impedance matching circuit 550 to an output lead 504. The other current conducting terminal (e.g., the source terminal) of the FET within transistor die 540 is electrically coupled through the die 540 to the flange 501 (e.g., to ground), in an embodiment.

Some of the components of the input impedance matching circuit 510 may be implemented within IPD assembly 513. Briefly, the input impedance matching circuit 510 is coupled between the input lead 502 and the control terminal of a FET within a transistor die 540. Similarly, some of the components of the output impedance matching circuit 550 may be implemented within IPD assembly 555. Briefly, output impedance matching circuit 550 is coupled between a current conducting terminal (e.g., the drain terminal) of a FET within the transistor die 540 and an output lead 504.

The IPD assembly 513 may include a base semiconductor substrate 582 (e.g., a silicon substrate, a silicon carbide substrate, a GaN substrate, or another type of semiconductor substrate, which may be referred to as an "IPD substrate" herein) and a build-up structure of alternating dielectric 517 and patterned conductive layers, where portions of the patterned conductive layers are electrically connected using conductive vias. As will be discussed in more detail below, the shunt capacitor of the input impedance matching circuit 510 is integrally formed within the IPD assembly 513 and may be electrically connected to conductive bond pad 515 at the top surface of the IPD assembly 513, and also may be electrically connected to the conductive flange 501 (e.g., to ground) using through substrate vias 526 to a conductive layer 586 on a bottom surface of the IPD assembly 513.

First, connections between the transistor die 540 and the input lead 502 through the input impedance matching circuit 510 will be described in more detail. More specifically, the input lead 502 is electrically coupled, through an instance of an input impedance matching circuit 510, to the input terminal 542 of the transistor die 540. The input terminal

542, in turn, is electrically coupled to the control terminal (e.g., the gate terminal) of a FET within the transistor die 540.

For example, in an embodiment, the input impedance matching circuit 510 may include two inductive elements 512, 516 (e.g., inductive elements 412, 416, FIG. 1) and a shunt capacitor 513 (e.g., shunt capacitance 414, FIG. 1). The first inductive element 512 (e.g., inductive element 412, FIG. 1) may be implemented as a first set of bondwires that are coupled between the input lead 502 and a conductive bond pad 515 (e.g., corresponding to connection node 415, FIG. 1) on a top surface of the IPD assembly 513. The second inductive element 516 (e.g., inductive element 416, FIG. 1) may be implemented as a second set of bondwires that are coupled between bond pad 515 (corresponding to connection node 415, FIG. 1) and the input terminal 542 of the transistor die 540.

According to an embodiment, a first electrode 518 (or terminal) of the shunt capacitor (e.g., shunt capacitor 414, FIG. 4) is electrically coupled 528 to the conductive bond pad 515 (and thus to bondwires 512, 516), and a second electrode 520 (or terminal) of the shunt capacitor is electrically coupled to the conductive flange (e.g., using conductive through substrate vias 526 that extend through the semiconductor substrate). The shunt capacitor may be implemented as a metal-insulator-metal (MIM) capacitor (or a set of parallel-coupled MIM capacitors) that is integrally formed as part of the IPD assembly 513. The shunt capacitor may also be implemented as a metal oxide semiconductor (MOS) capacitor in another embodiment. In an alternate embodiment, the shunt capacitor 513 may be implemented using one or more discrete capacitors coupled to a top surface of the IPD assembly 513, or using another type of capacitor.

According to an embodiment, bondwires 512 may have an inductance value in a range between about 200 pH to about 600 pH, bondwires 516 may have an inductance value in a range between about 200 pH to about 600 pH, and shunt capacitor 514 may have a capacitance value in a range between about 60 pF to about 200 pF. In other embodiments, some or all of the above-listed components may have smaller or larger component values than the above-given ranges.

The IPD assembly 555 also may include a base semiconductor substrate 566 (e.g., a silicon substrate, a silicon carbide substrate, a GaN substrate, or another type of semiconductor substrate, which may be referred to as an "IPD substrate" herein) and a build-up structure of alternating dielectric 557 and patterned conductive layers. As will be discussed in more detail below, the shunt capacitor of the output impedance matching circuit 550 is integrally formed within the IPD assembly 555 and may be electrically connected to conductive bond pad 559 at the top surface of the IPD assembly 555, and also may be electrically connected through pad 592, bondwires 558, and pad 595 to the conductive flange 501 (e.g., to ground).

Connections between the transistor die 540 and the output lead 504 through the output impedance matching circuit 550 will be described in more detail. More specifically, the output lead 504 is electrically coupled, through an instance of an output impedance matching circuit 550, to the second terminal 544 of the transistor die 540. The second terminal 544, in turn, is electrically coupled to the drain terminal of a FET within the transistor die 540.

For example, in an embodiment, the output impedance matching circuit 540 may include three inductive elements 552, 554, 558 (e.g., inductive elements 452, 454, 458, FIG. 4) and a shunt capacitor (e.g., shunt capacitance 456, FIG. 4). The first inductive element 552 (e.g., inductive element 452, FIG. 4) may be implemented as a third set of bondwires that are coupled between the output lead 504 and a conductive bond pad 544 (e.g., corresponding to connection node 444, FIG. 4) on a top surface of the transistor die 540. The second inductive element 554 (e.g., inductive element 454, FIG. 4) may be implemented as a fourth set of bondwires that are coupled between bond pad 559 (corresponding to connection node 459, FIG. 1) and second terminal 544 of the transistor die 540. The third inductive element 558 (e.g., inductive element 458, FIG. 4) may be implemented as a fifth set of bondwires that are coupled between bond pad 592 (corresponding to connection node 492, FIG. 4) and the flange 501 or ground.

According to an embodiment, a first electrode 562 (or terminal) of the shunt capacitor 556 (e.g., shunt capacitor 456, FIG. 1) is electrically coupled to the conductive bond pad 559 using via 590 (and thus to bondwires 554), and a second electrode 560 (or terminal) of the shunt capacitor 556 is electrically coupled to the conductive flange 501 through pad 595, bondwires 558, and pad 592. The shunt capacitor 556 may be implemented as a MIM capacitor (or a set of parallel-coupled MIM capacitors) that is integrally formed as part of the IPD assembly 555. The shunt capacitor may also be implemented as a MOS capacitor in another embodiment. In a more specific embodiment, the second electrode 560 of the shunt capacitor 556 is "directly connected" to the bond pad 592, where "directly connected" means electrically connected, possibly with one or more conductive traces and/or conductive vias 570, but without intervening circuit elements (i.e., circuit elements that have more than a trace inductance, where a "trace inductance" is an inductance less than about 100 pH). Because the shunt capacitor 556 and the bond pad 592 are "directly connected," and the bond pad 592 also has only a trace inductance, in an embodiment, the bondwires 558 and the shunt capacitor 556 also may be considered to be "directly connected." Likewise the shunt capacitor 556, bond pad 559, and bondwires 554 are "directly connected." In an alternate embodiment, the shunt capacitor 456 may be implemented using one or more discrete capacitors coupled to a top surface of the IPD assembly 555, or using another type of capacitor.

According to an embodiment, bondwires 552 may have an inductance value in a range between about 200 pH to about 600 pH, bondwires 554 may have an inductance value in a range between about 200 pH to about 600 pH, bondwires 558 may have an inductance value in a range between about 100 pH to about 300 pH, and shunt capacitor 556 may have a capacitance value in a range between about 60 pF to about 200 pF. Further, bondwires 552 and 554 may have a mutual inductance between about 5 to about 100 pH, bondwires 552 and 558 may have a negative mutual inductance between about 5 to about 150 pH, and bondwires 554 and 558 may have a negative mutual inductance between about 5 to about 100 pH. In other embodiments, some or all of the above-listed components or inductances may have smaller or larger component or inductance values than the above-given ranges.

The various mutual inductances between bondwires 552, 554, 558 may be selected based upon various design choices regarding the size and location of the bondwires 552, 554, 558. Because the current flowing through bondwire 558 is in the opposite direction of the current flowing in bondwires 552, 554, a negative mutual inductance results, which reduces the overall mutual inductance between the bondwires 552, 554, 558. Hence, potential degradation due to the mutual inductance between bondwires 152, 154 of FIG. 1 may be reduced by utilizing bondwires 558. Further, it is noted that the bondwires 552, 554, 558 are substantially parallel to one another.

It is further noted, that bondwires 554 may be substantially shielded from bondwires 552 by bondwires 558. As illustrated in FIG. 5, bondwires 558 are positioned in between bondwires 552 and 554 to provide this shielding. The number and grouping of the bondwires may be different from those shown in FIG. 5, although desirably bondwires 558 provide the desired shielding. For example, bondwires 554 are shown in groups of one bondwire (i.e., only a single bondwire 554 is positioned between adjacent bondwires 558), but that number could be more. Further, bondwires 558 are also shown in in groups of one bondwire (i.e., only a single bondwire 558 is positioned between adjacent bondwires 554, 512), but that number could also be more.

According to an embodiment, device 500 is incorporated in an air cavity package, in which transistor die 540, the IPD assemblies 544 and 555, and various other components are located within an enclosed air cavity. Basically, the air cavity is bounded by flange 501, the isolation structure 503, and a cap (not shown) overlying and in contact with the isolation structure 503 and leads 502 and 504. In FIG. 5, an example interior perimeter of the cap is indicated by dashed box 509, while an exterior perimeter would align with the outer perimeter of flange 501. In other embodiments, the components of device 500 may be incorporated into an overmolded package (i.e., a package in which the electrical components within the active device area are encapsulated with a non-conductive molding compound, and in which portions of the leads 502 and 504 also may be encompassed by the molding compound). In an overmolded package, the isolation structure 503 may be excluded.

FIGS. 4-6 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

Figure 7:
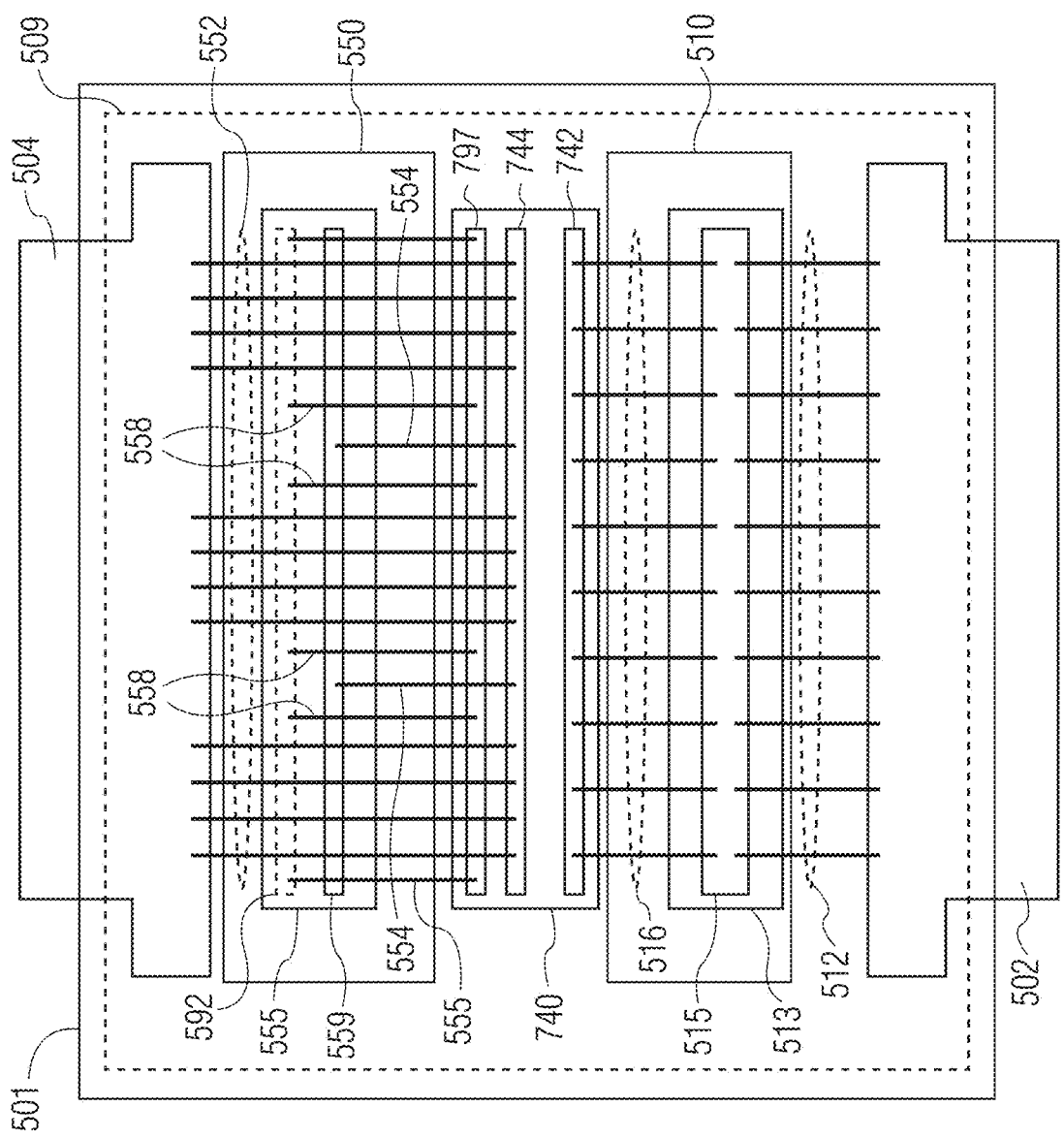
FIG. 7 is a top view of another embodiment of a layout of an RF amplifier device that embodies an instance of the circuit of FIG. 4.

FIG. 7 is a top view of another embodiment of a layout of RF amplifier device 700 that embodies an instance of the circuit 400 of FIG. 4. The device 700 is different from the device 500 of FIG. 5, in the construction of the transistor die 740, and in how the bondwire 558 is grounded. In device 500 (FIGS. 4-6), the bondwire 558 is grounded through a connection to the flange 501. As discussed above, this may be done by directly connecting the bondwire 558 to the flange or by using a connecting structure 595. In device 700, the bondwire 558 is connected to a pad 797 on the top surface of the transistor die 740, where the pad 797 is electrically coupled through conductive structures within the transistor die 740 (e.g., vias and portions of patterned conductive layers) to a conductive layer (not shown) on the bottom surface of transistor die 740. The bottom conductive layer, in turn, is connected (grounded) to the flange. Otherwise, the devices 540, 740 may be substantially the same.

Figure 8:
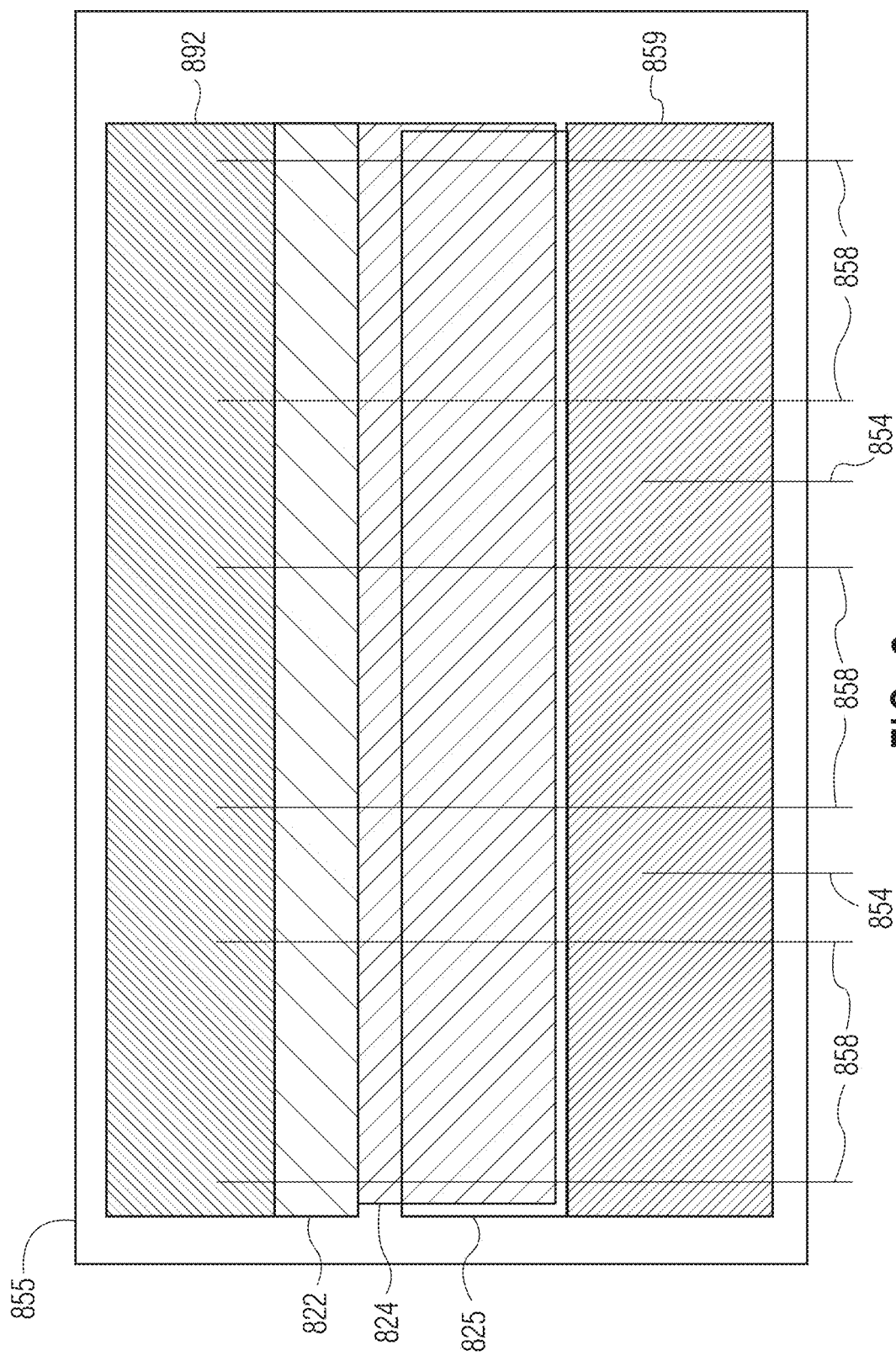
FIG. 8 illustrates a top view of an embodiment of an output shunt capacitor that may be used in the devices of FIGS. 5 and 7.

FIG. 8 illustrates a top view of an embodiment of an output shunt capacitor 856 that may be incorporated in an output IPD (e.g., output IPDs 555) used in the devices 500, 700 described above. The shunt capacitor 856 includes has first and second plates 824, 825 (or electrodes), which overlap each other, and which are separated by a dielectric. The shunt capacitor 856 includes a bond pad 892 that is connected to the first plate 824 using conductive vias (e.g., vias in region 822). The shunt capacitor 856 also includes a bond pad 859 that is connected to the second plate 825. Because the bond pads 892, 859 are on opposite sides of the shunt capacitor 856, when the bond pads 829, 859 are connected to the transistor die and to ground (e.g., using bondwires 854, 858), at least one set of bondwires connected to the shunt capacitor 856 crosses over the shunt capacitor 856, as will be described in conjunction with FIGS. 10 and 12.

Figure 9:
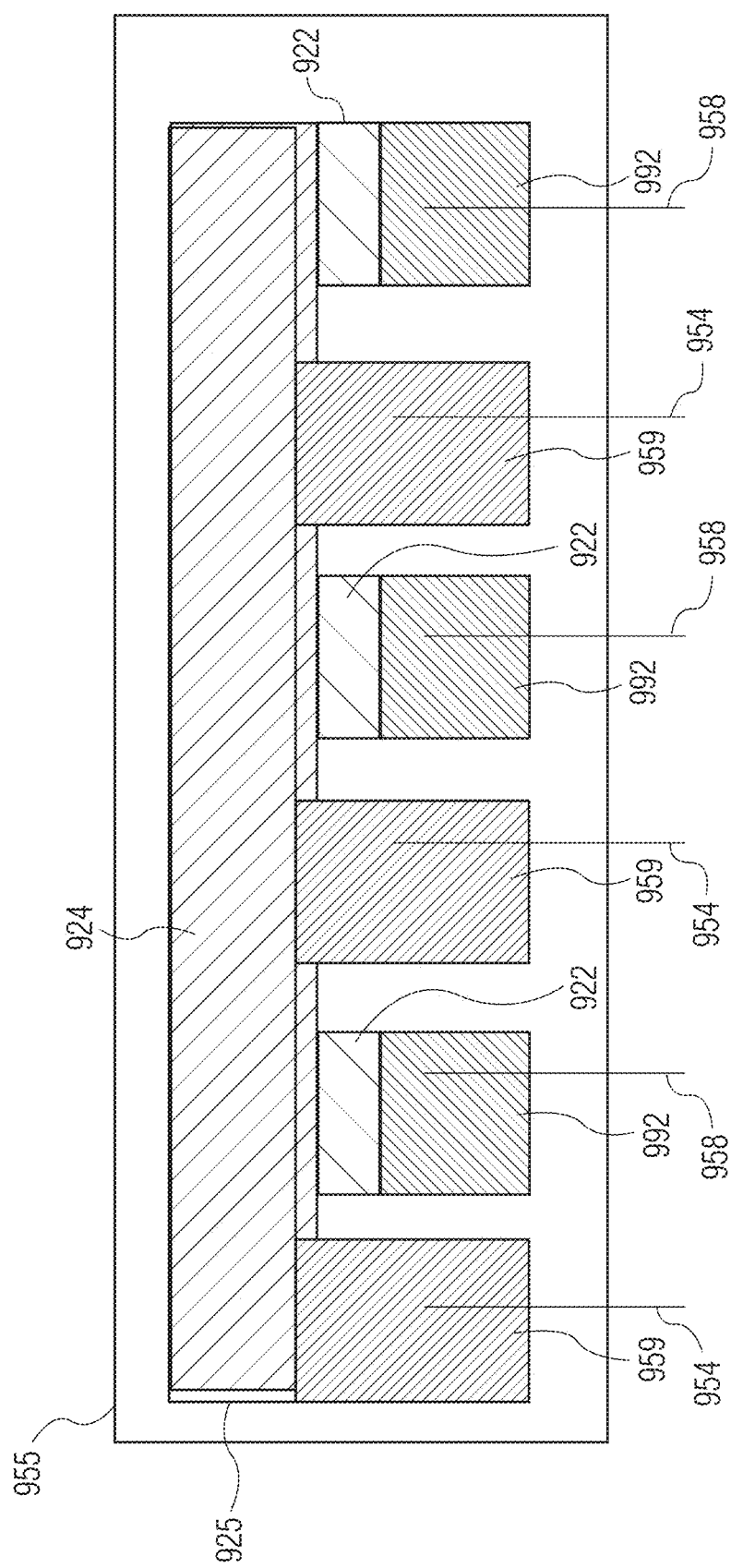
FIG. 9 illustrates a top view of an embodiment of an output shunt capacitor that may be used in the devices of FIGS. 5 and 7.

FIG. 9 illustrates a top view of an embodiment of an output shunt capacitor 956 that alternatively may be used in the devices 500, 700 described above. The shunt capacitor 956 has first and second plates 924, 925. The shunt capacitor 956 includes a plurality of bond pads 992, each of which is connected to the first plate 924 using vias (e.g., vias in regions 922). The shunt capacitor 956 also includes a plurality of bond pads 959, each of which is connected to the second plate 925. Because the bond pads 992, 959 are on the same side of the shunt capacitor 956, neither set of bondwires (e.g., bondwires 954, 958) connected to the shunt capacitor 956 has to cross over the shunt capacitor 956, as will be described in conjunction with FIGS. 11 and 13.

FIGS. 10-13 illustrate different configurations of devices 500, 700 using the shunt capacitors 856, 956.

Figure 10:
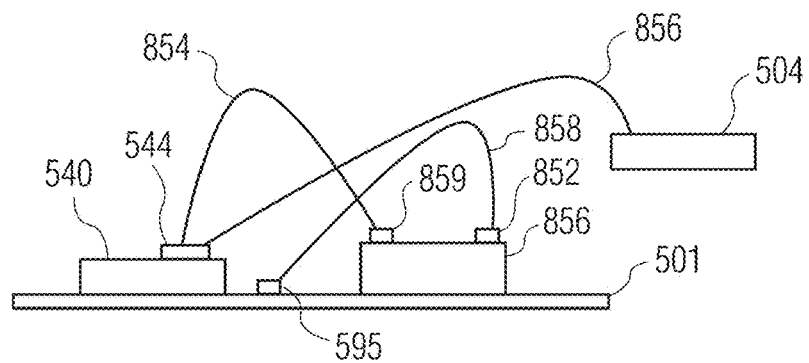
FIG. 10 is a simplified side view of the device of FIG. 5 showing the bondwire connections using the shunt capacitor of FIG. 8.

FIG. 10 is a simplified side view of an embodiment of the device 500 that utilizes shunt capacitor 856 (FIG. 8) in the output IPD (e.g., in IPD 555, FIG. 5). In this embodiment, bondwires 858 and bondwires 854 are connected to opposite sides of the shunt capacitor 856 (e.g., to bond pads 892 and 859, respectively). In this embodiment, bondwires 858 are grounded to the flange 501 either directly or through pad 595. As previously described in conjunction with FIGS. 5 and 6, bondwires 854 connect the transistor die 540 to the shunt capacitor 856, and bondwires 852 connect the transistor die 540 to the output lead 504.

Figure 11:
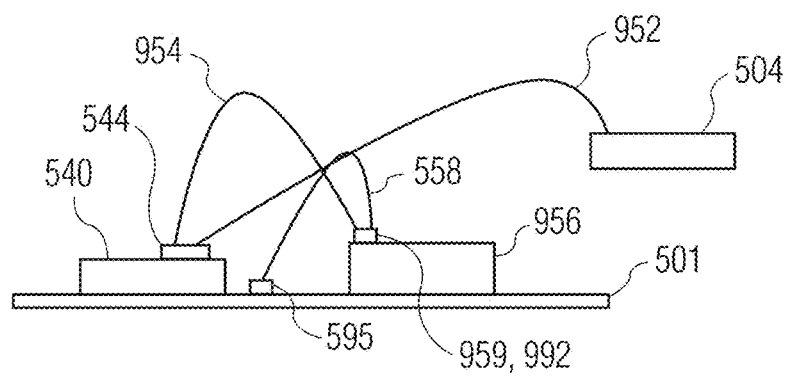
FIG. 11 is a simplified side view of the device of FIG. 5 showing the bondwire connections using the shunt capacitor of FIG. 9.

FIG. 11 is a simplified side view of an embodiment of the device 500 that utilizes shunt capacitor 956 (FIG. 9) in the output IPD (e.g., in IPD 555, FIG. 5). In this embodiment, bondwires 958 and bondwires 954 are connected to the same side of the shunt capacitor 956 (e.g., to bond pads 992 and 959, respectively). In this embodiment, bondwires 558 are grounded to the flange 501 either directly or through pad 595. As previously described in conjunction with FIGS. 5 and 6, bondwires 954 connect the transistor die 540 to the shunt capacitor 956, and bondwires 952 connect the transistor die 540 to the output lead 504.

Figure 12:
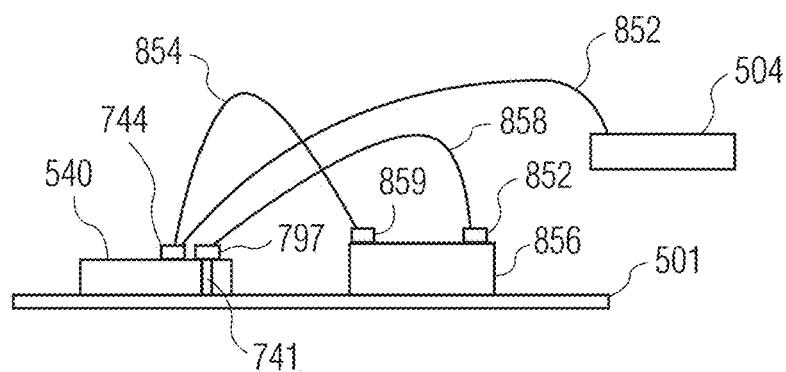
FIG. 12 is a simplified side view of the device of FIG. 7 showing the bondwire connections using the shunt capacitor of FIG. 8.

FIG. 12 is a simplified side view of an embodiment of the device 700 that utilizes shunt capacitor 856 (FIG. 8) in the output IPD (e.g., in IPD 555, FIG. 7). In this embodiment, bondwires 558 and bondwires 554 are connected to opposite sides of the shunt capacitor 856 (e.g., to bond pad 892 and 859, respectively). In this embodiment, bondwires 558 are connected to the transistor die 740 (e.g., to bondpad 797) and then grounded to the flange 501 through conductive structures 741 in the transistor die 740. As previously described, bondwires 854 connect the transistor die 740 to the shunt capacitor 856, and bondwires 852 connect the transistor die 740 to the output lead 504.

Figure 13:
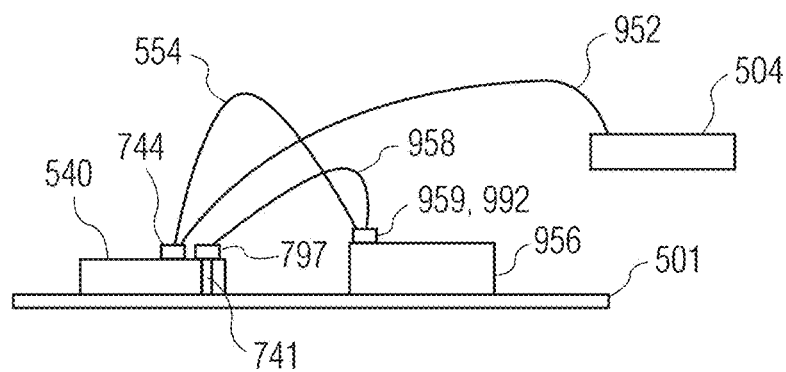
FIG. 13 is a simplified side view of the device of FIG. 7 showing the bondwire connections using the shunt capacitor of FIG. 9.

FIG. 13 is a simplified side view of an embodiment of the device 700 that utilizes shunt capacitor 956 FIG. 9) in the output IPD (e.g., in IPD 555, FIG. 7). In this embodiment, bondwires 558 and bondwires 554 are connected to the same side of the shunt capacitor 956 (e.g., to bond pads 992 and 959, respectively). In this embodiment, bondwires 558 are connected to the transistor die 740 (e.g., to bond pad 797) and then grounded to the flange 501 through conductive structures 741 in the transistor die 740. As previously described, bondwires 954 connect the transistor die 740 to the shunt capacitor 956, and bondwires 952 connect the transistor die 740 to the output lead 504.

Figure 14:
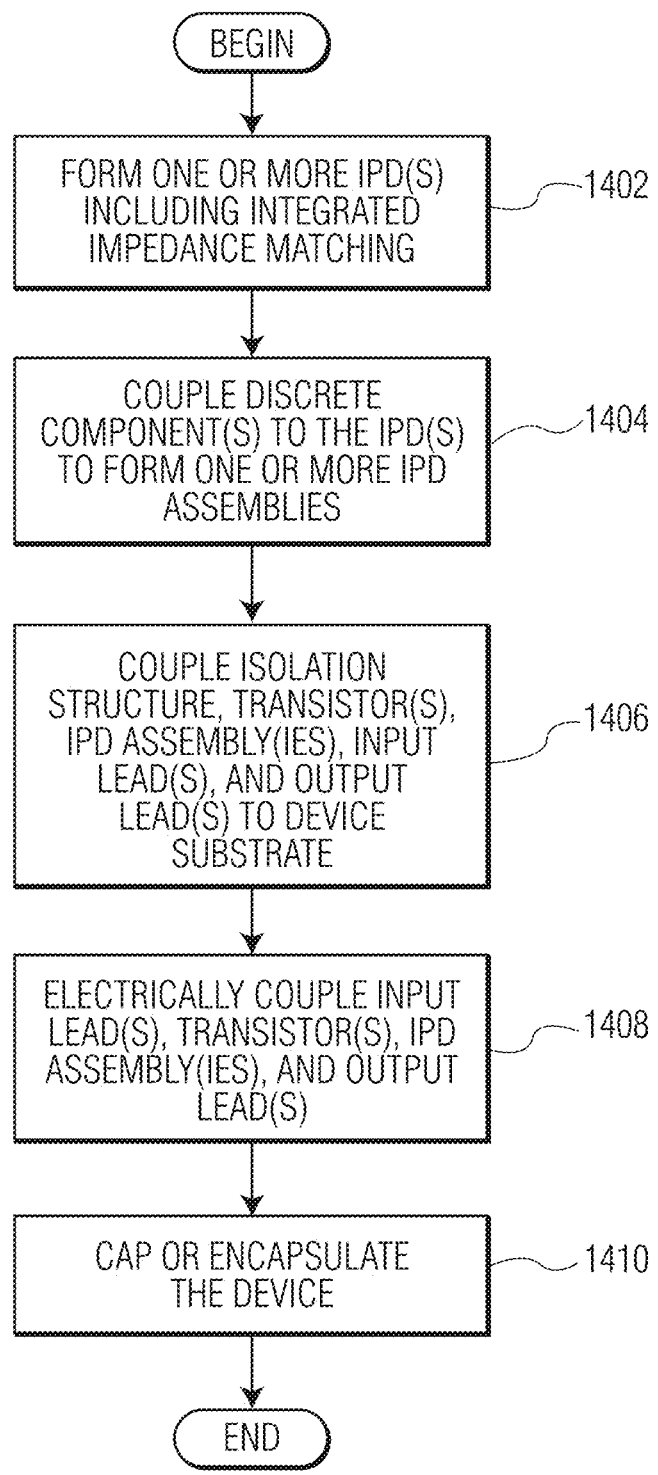
FIG. 14 is a flowchart of a method for fabricating a packaged RF power amplifier device (e.g., devices of FIG. 5 or FIG. 7) that includes embodiments of input and output impedance matching circuits in accordance with various example embodiments.

FIG. 14 is a flowchart of a method for fabricating a packaged RF power amplifier device (e.g., device 500, FIG. 5 or device 700 FIG. 7) that includes embodiments of input and output impedance matching circuits, (e.g., circuits 410 and 450), in accordance with various example embodiments. The method may begin, in blocks 1402-1404, by forming one or more IPD assemblies. More specifically, in block 1402, one or more input and output IPDs (e.g., IPDs 513, 555, 856, 956, FIGS. 5-7, 10-13) may be formed. According to an embodiment, the input IPD (e.g., IPD 513) includes components of an input impedance matching circuit. For example, each input IPD may include one or more integrated shunt capacitors (e.g., capacitor 414, FIG. 4). According to an embodiment, output IPD (e.g., IPD 555, 856, 956) includes components of an output impedance matching circuit. For example, each output IPD may include one or more integrated shunt capacitors (e.g., capacitor 555, 856, 956, FIGS. 4-13). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bond pads (e.g., bondpads 515, 559, 592, 859, 892, 959, 992, FIGS. 4-9), which may accept attachment of inductive elements (e.g., bondwires 512, 516, 552, 554, 558, FIGS. 5-7, 10-13). In addition, in block 1404, when some components corresponding to various circuit elements (e.g., capacitors 414, 456, FIG. 4) are implemented as discrete components (rather than integrated components), those discrete components may be coupled to conductors exposed at the surface of each IPD to form one or more IPD assemblies.

In block 1406, for an air cavity embodiment, an isolation structure 503 is coupled to a device substrate (e.g., flange 401). In addition, one or more active devices (e.g., transistors 440) and IPD assemblies (e.g., IPD assemblies 513, 555, 855, 9565 are coupled to a portion of the top surface of the substrate that is exposed through an opening in the isolation structure 503. Leads (e.g., input and output leads 402, 404) are coupled to the top surface of the isolation structure 503. For overmolded (e.g., encapsulated) device embodiments, the isolation structure 503 may be excluded, and the substrate and leads may form portions of a leadframe.

In block 1408, the input lead(s), transistor(s), IPD assembly(ies), and output lead(s) are electrically coupled together. For example, the electrical connections may be made using bondwires between the various device components and elements, as discussed previously. Some of the bondwires correspond to inductive components of input or output matching circuits (e.g., bondwires 512, 516, 552, 554, 558, FIGS. 5-7, 10-13). Finally, in block 1410, the device is capped (e.g., for an air cavity package) or encapsulated (e.g., with mold compound for an overmolded package). The device may then be incorporated into a larger electrical system (e.g., a Doherty amplifier or other type of electrical system).

The above description describes a packaged radio frequency (RF) amplifier device including: a device substrate; an input lead coupled to the device substrate; an output lead coupled to the device substrate; a transistor die coupled to the device substrate, wherein the transistor die includes a transistor, a transistor input terminal coupled to the input lead, and a transistor output terminal coupled to the output lead; an output impedance matching circuit coupled to the output lead and the transistor output terminal, wherein the output impedance matching circuit includes a first set of bondwires coupled between the output lead and the transistor output, an output capacitor including a first terminal and a second terminal, a second set of bondwires coupled between the transistor output and a first terminal of the output capacitor, and a third set of bondwires coupled between the second terminal of the output capacitor and a ground reference node, wherein the third set of bondwires are substantially parallel to the first and second set of bondwires.

The above description also describes a method of manufacturing an RF amplifier device, the method including the steps of: coupling an input lead to a device substrate; coupling an output lead to the device substrate; coupling a transistor die to the device substrate between the input and output leads, wherein the transistor die includes a transistor and a transistor input terminal; coupling an output impedance matching circuit between the output lead and the transistor output terminal, wherein the output impedance matching circuit includes a first set of bondwires coupled between the output lead and the transistor output, an output capacitor including a first terminal and a second terminal, a second set of bondwires coupled between the transistor output and a first terminal of the output capacitor, and a third set of bondwires coupled between the second terminal of the output capacitor and a ground reference node, wherein the third set of bondwires are substantially parallel to the first and second set of bondwires.

The above description also describes a radio frequency (RF) amplifier including: a transistor die with a transistor and a transistor output terminal; an output impedance matching circuit coupled to the output lead and the transistor output terminal, wherein the output impedance matching circuit includes a first set of bondwires coupled between the output lead and the transistor output, an output capacitor including a first terminal and a second terminal, a second set of bondwires coupled between the transistor output and a first terminal of the output capacitor, and a third set of bondwires coupled between the second terminal of the output capacitor and a ground reference node, wherein the third set of bondwires are substantially parallel to the first and second set of bondwires.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
   a device substrate;
   an input lead coupled to the device substrate;
   an output lead coupled to the device substrate;
   a transistor die coupled to the device substrate, wherein the transistor die includes a transistor, a transistor input terminal coupled to the input lead, and a transistor output terminal coupled to the output lead;
   an output impedance matching circuit coupled to the output lead and the transistor output terminal, wherein the output impedance matching circuit includes
      a first set of bondwires coupled between the output lead and the transistor output,
      an output capacitor including a first terminal and a second terminal,
      a second set of bondwires coupled between the transistor output and a first terminal of the output capacitor, and
      a third set of bondwires coupled between the second terminal of the output capacitor and a ground reference node, wherein the third set of bondwires are substantially parallel to the first and second set of bondwires, and
   wherein the first set of bondwires, the second set of bondwires, and the third set of bondwires have profiles configured to increase the electromagnetic coupling between the first and third sets of bondwires, to decrease the electromagnetic coupling between the first and second sets of bondwires, and to decrease the electromagnetic coupling between the second and third sets of bondwires.

2. The packaged RF amplifier device of claim 1, wherein the output capacitor is an integrated passive device.

3. The packaged RF amplifier device of claim 2, wherein the first and second terminals of the output capacitor are on opposite sides of the integrated passive device.

4. The packaged RF amplifier device of claim 2, wherein the first and second terminals of the output capacitor are on the same side of the integrated passive device.

5. The packaged RF amplifier device of claim 1, wherein the bondwires of the third set of bondwires are shielding the bondwires of the first set of bondwires and the bondwires of the second set of bond wires.

6. The packaged RF amplifier device of claim 5, wherein third set of bondwires shields the first set of bondwires from the second set of bondwires.

7. The packaged RF amplifier device of claim 1, wherein the ground reference node is a flange.

8. The packaged RF amplifier device of claim 1, wherein the ground reference node is ground pad on the transistor die.

9. The packaged RF amplifier device of claim 1, further comprising an input impedance matching circuit including
   a first connection node,
   an input shunt capacitor with a first terminal connected to a ground and a second terminal connected to the first connection node,
   a fourth set of bondwires coupled between the input lead and first connection node,
   a fifth set of bondwires coupled between the first connection node and the transistor input terminal.

10. A method of manufacturing an RF amplifier device, the method comprising the steps of:
   coupling an input lead to a device substrate;
   coupling an output lead to the device substrate;
   coupling a transistor die to the device substrate between the input and output leads, wherein the transistor die includes a transistor and a transistor input terminal;
   coupling an output impedance matching circuit between the output lead and the transistor output terminal, wherein the output impedance matching circuit includes
      a first set of bondwires coupled between the output lead and the transistor output,
      an output capacitor including a first terminal and a second terminal,
      a second set of bondwires coupled between the transistor output and a first terminal of the output capacitor, and
      a third set of bondwires coupled between the second terminal of the output capacitor and a ground reference node, wherein the third set of bondwires are substantially parallel to the first and second set of bondwires, and wherein the bondwires of the third set of bondwires are between the bondwires of the first set of bondwires and the bondwires of the second set of bond wires.

11. The method of claim 10, wherein:

coupling an output impedance matching circuit between the output lead and the transistor output terminal includes coupling the first set of bondwires between the output lead and the transistor output, coupling the output capacitor to the device substrate, wherein the output capacitor includes a first terminal and a second terminal, coupling the second set of bondwires between the transistor output and a first terminal of the output capacitor, and coupling the third set of bondwires between the second terminal of the output capacitor and the ground reference node.

12. The method of claim 10, wherein the output capacitor is an integrated passive device.

13. The method of claim 12, wherein the first and second terminals of the output capacitor are on opposite sides of the integrated passive device.

14. The method of claim 12, wherein the first and second terminals of the output capacitor are on the same side of the integrated passive device.

15. The method of claim 10, further comprising coupling an input impedance matching circuit between the input lead and the transistor input terminal, wherein coupling the input impedance matching circuit includes coupling an input shunt capacitor with a first terminal and a second terminal to the device substrate and coupling the first terminal to a ground and the second terminal to a first connection node, coupling a fourth set of bondwires between the input lead and first connection node, and coupling a fifth set of bondwires between the first connection node and the transistor input terminal.

16. A radio frequency (RF) amplifier comprising:

a transistor die with a transistor and a transistor output terminal;

an output impedance matching circuit coupled to the output lead and the transistor output terminal, wherein the output impedance matching circuit includes a first set of bondwires coupled between the output lead and the transistor output, an output capacitor including a first terminal and a second terminal, a second set of bondwires coupled between the transistor output and a first terminal of the output capacitor, and a third set of bondwires coupled between the second terminal of the output capacitor and a ground reference node, wherein the third set of bondwires are substantially parallel to the first and second set of bondwires, and wherein the bondwires of the third set of bondwires are between the bondwires of the first set of bondwires and the bondwires of the second set of bond wires.

17. The RF amplifier of claim 16, wherein the output capacitor is an integrated passive device.

* * * * *